United States Patent [19]

Helmstetter

[11] Patent Number: 4,947,980
[45] Date of Patent: Aug. 14, 1990

[54] METHOD AND APPARATUS FOR STOPPING AND CLAMPING SUBSTRATES

[75] Inventor: Christopher M. Helmstetter, West Trenton, N.J.

[73] Assignee: American Telephone and Telegraph Company, New York, N.Y.

[21] Appl. No.: 318,084

[22] Filed: Mar. 2, 1989

[51] Int. Cl.⁵ ............................................. B65G 47/00
[52] U.S. Cl. .................................................. 198/345.3
[58] Field of Search .......................................... 198/345

[56] References Cited

U.S. PATENT DOCUMENTS

| | | |
|---|---|---|
| 2,851,145 | 9/1958 | Gagnon ................................ 198/345 |
| 3,690,433 | 9/1972 | Buklini ................................ 198/345 |
| 4,253,559 | 3/1981 | Myers et al. ......................... 198/345 |
| 4,539,479 | 9/1985 | Sheets et al. ..................... 198/345 X |
| 4,562,919 | 1/1986 | Cattani ............................. 198/345 X |
| 4,611,704 | 9/1986 | Burgess, Jr. ......................... 198/345 |
| 4,674,620 | 6/1987 | Inoue ................................... 198/345 |
| 4,706,796 | 11/1987 | Chambers ............................ 198/345 |
| 4,736,830 | 4/1988 | Hofmann ............................. 198/345 |

FOREIGN PATENT DOCUMENTS 3618584 12/1987 Fed. Rep. of Germany ...... 198/345
0114920 6/1986 Japan .................................. 198/345

Primary Examiner—Robert J. Spar
Assistant Examiner—James R. Bidwell
Attorney, Agent, or Firm—Robert B. Levy; Ruloff F. Kip, Jr.

[57] ABSTRACT

In a facility for conveying PWBs in a path of travel, two stop/clamp devices are magnetically clamped along the path to be spaced in its length and to be within the path width occupied by the traveling board. Each of the devices has stop and clamp elements shiftable as a unit between out positions at which they are disposed in the path and in positions at which they and the rest of their device do not interfere with the travel in the path of the boards. When in the out position, the leading device is adapted to stop the travel of such a board, and both devices are then selectively operable to grip and then release the stopped board. Sensors on the leading device are used to detect the presence of a board near to and at such device. A computer is responsive to such sensors and is used to produce a desired sequence of operations of such two devices and of other units.

10 Claims, 6 Drawing Sheets

METHOD AND APPARATUS FOR STOPPING AND CLAMPING SUBSTRATES

FIELD OF THE INVENTION

This invention relates generally to apparatus and methods for handling articles and, more particularly, to apparatus and methods of such kind for stopping and clamping articles being conveyed.

BACKGROUND OF THE INVENTION

The background of the invention will be described in terms of the handling of articles which are circuit boards. Most circuit boards are populated with components in an assembly line fashion to produce a circuit package (pack). Typically, a blank or unpopulated board is placed at one end of a pair of spaced, endless belts and is carried therealong from station to station, where various operations, such as component placement, inspection, and soldering, are performed. At certain stations (especially those where component placement and inspection occur) it is necessary to hold the circuit board stationary. Thus, a circuit board carried by the endless belts must be stopped and held at such a station.

Presently, separate mechanically complex devices are employed to stop and then clamp a traveling circuit board. Moreover, such devices are usually specific to the particular station where a given operation is performed.

SUMMARY OF THE INVENTION

The present invention is directed to a combined stop and clamping device which can be employed at different assembly stations. The stop and clamp device of the present invention, when placed along the path of travel of a circuit board or other article, will advance into the path to stop and clamp the article when required. After the particular operation at the station is performed, the stop and clamp device releases the article and then retracts from the path, permitting the previously clamped article to pass by the device.

BRIEF DESCRIPTION OF THE DRAWING

For a better understanding of the invention, reference is made to the following description of exemplary embodiments thereof, and to the accompanying drawings wherein:

FIG. 2 is also a schematic diagram of the control system for such facility;

Figure 1:
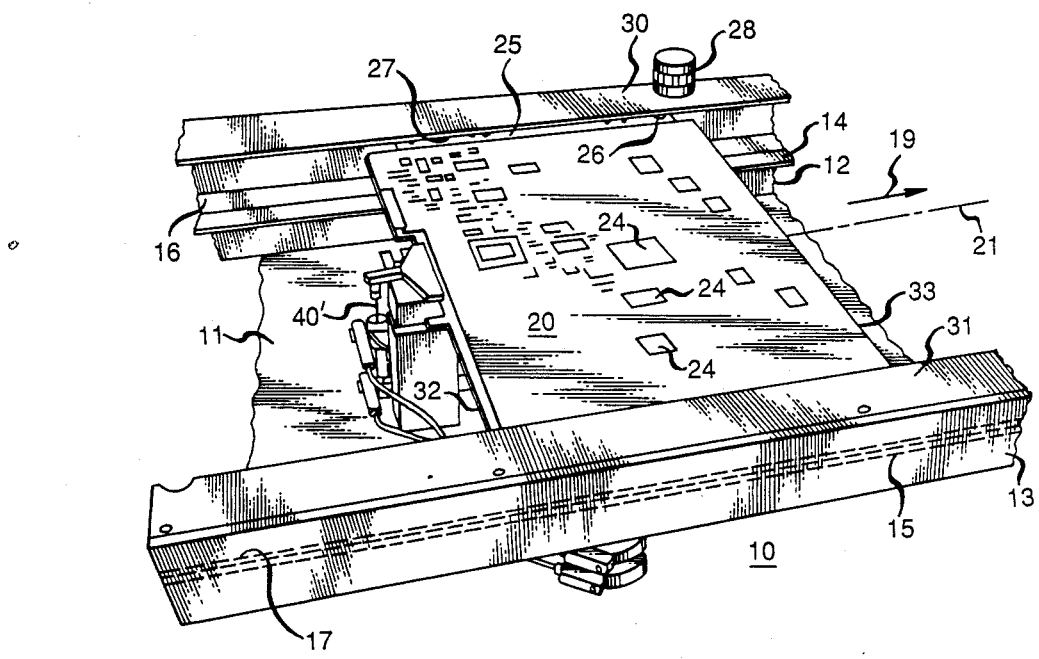
FIG. 1 is a broken-away, perspective view of part of a conveyor facility according to the invention and including two portable stop/clamp devices of which only one is shown in FIG. 1.

In the description which follows elements designated by the same reference numerals, differentiated from one another by being with or without a prime (') suffix, are elements which are counterparts of each other, and a description herein of any such element shall, unless the context otherwise indicates, be taken to apply equally to its counterpart.

DETAILED DESCRIPTION OF EMBODIMENTS

Referring now to FIG. 1, the reference numeral 10 designates a conveyor facility comprising a flat, horizontal iron bed plate 11, a pair of laterally spaced, longitudinal, parallel side assemblies 12,13 upstanding from laterally opposite sides of plate 11, and a pair of rails 14,15 respective to assemblies 12,13 and disposed on them above such plate 11 to project out from such assemblies laterally towards each other. Associated with the rails is conveyor means in the form of a pair of endless belts 16,17, having upper portions riding on, respectively, the rails 14 and 15. The two belts are each driven by a reversible electric motor 18 (only one shown in FIG. 2) so that their upper portions are movable in either of the two longitudinal directions of the facility. For the purposes hereof, it will be assumed that each motor 18, when on, is energized to drive such portions in FIG. 1 in the direction indicated by arrow 19.

Seated on belts 16 and 17 are laterally opposite edges of an article in the form of a printed wiring board (PWB) 20 supported above plate 11 to be transversely spaced therefrom and to straddle the gap between the two belts. The lateral edges of the PWB are disposed adjacent to, and are guided by, portions of assemblies 12,13 which define for the PWB a longitudinal path 21 of travel in the direction of arrow 19 or in the opposite direction, depending on how motors 18 are energized.

On its upper face, the PWB 20 has mounted thereon numerous electrical components 24 and, at its far edge, the board includes a narrow strip 25 extending along the board's margin and having formed therein aligning holes 26,27. Above the path of travel of board 20 are a pair of aligners 28 (only one shown) adapted when activated to insert tooling pins (not shown) into holes 26,27 in the board 20 and other boards. Also, above such path are a pair of side clamps 30,31 adapted, when activated, to clamp down on the laterally opposite sides of a board beneath them.

Positioned adjacent to the rear or trailing edge portion 32 of board 20 is a portable stop/clamp device 40' positioned on plate 11 to be in the middle (in the lateral dimension) of the path of travel 21 of the board 20. Device 40' is one of a pair of such devices of which the other one, stop/clamp device 40, is shown in FIGS. 2-6 and will now be considered.

Figure 2:
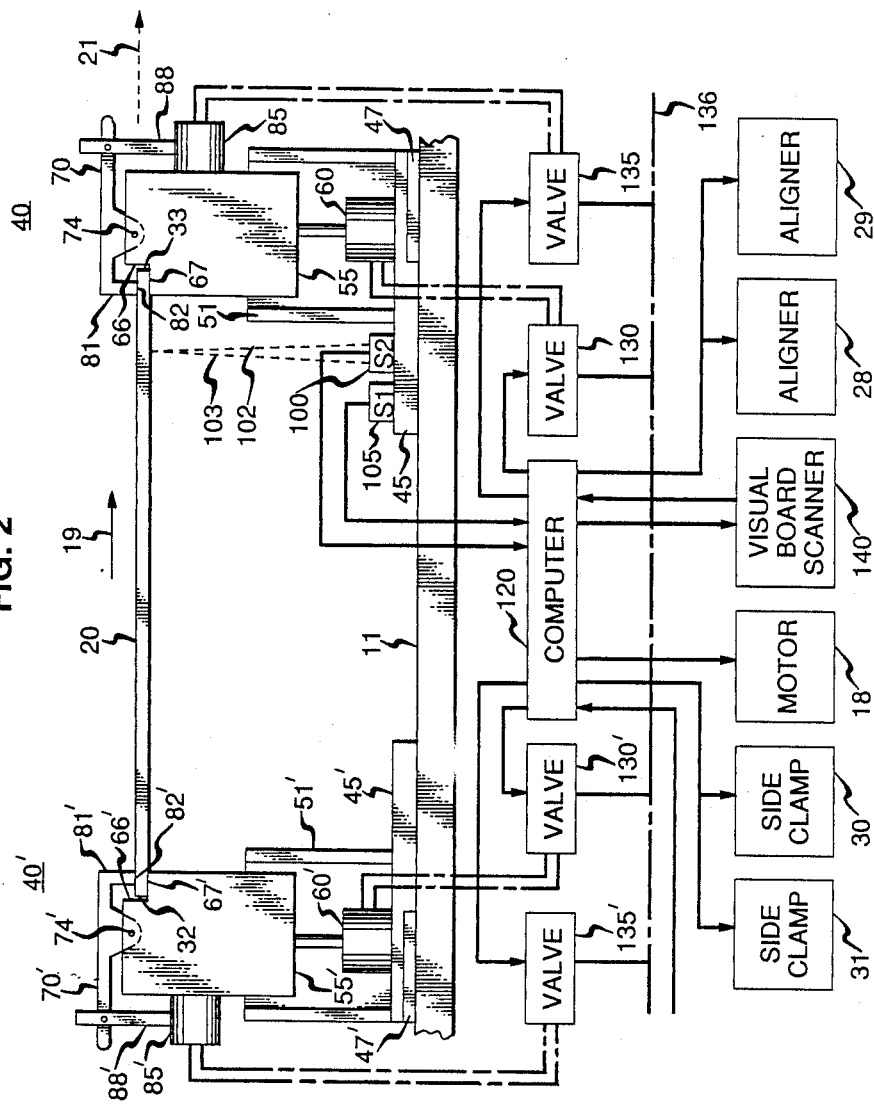
FIG. 2 is a schematic view of the structure of the FIG. 1 facility including both such devices.
Figure 3:
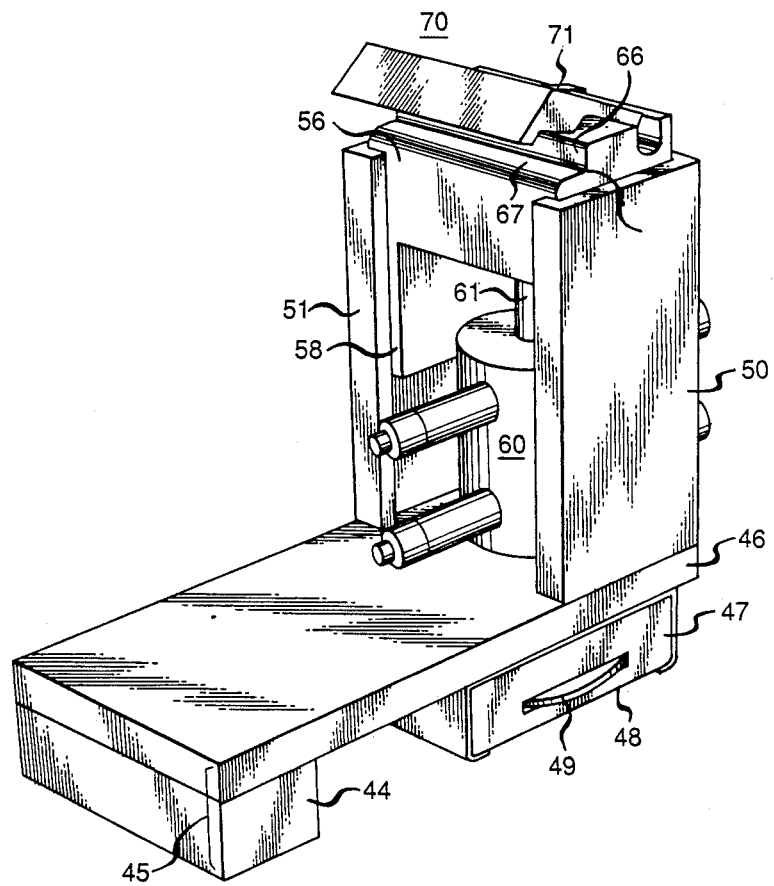
FIG. 3 is an isometric view of the structure of the right hand stop/clamp device of FIG. 2 with its sensors omitted for clarity.
Figure 4:
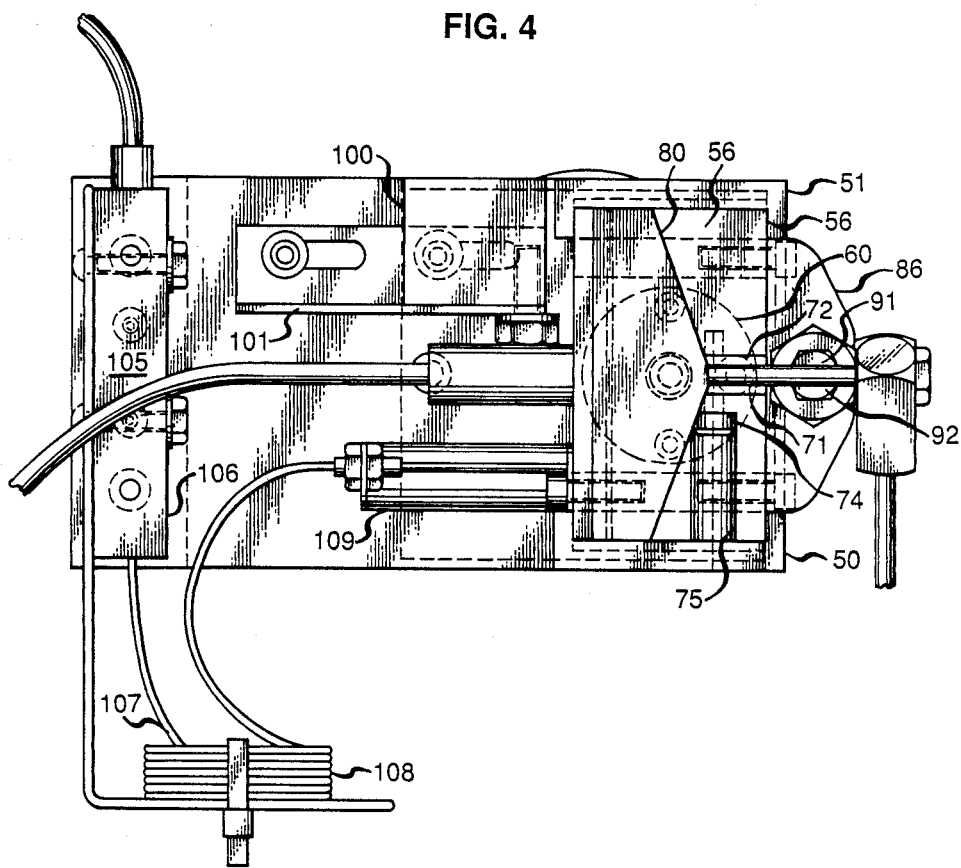
FIG. 4 is a plan view of the right hand stop clamp device of FIG. 2.
Figure 5:
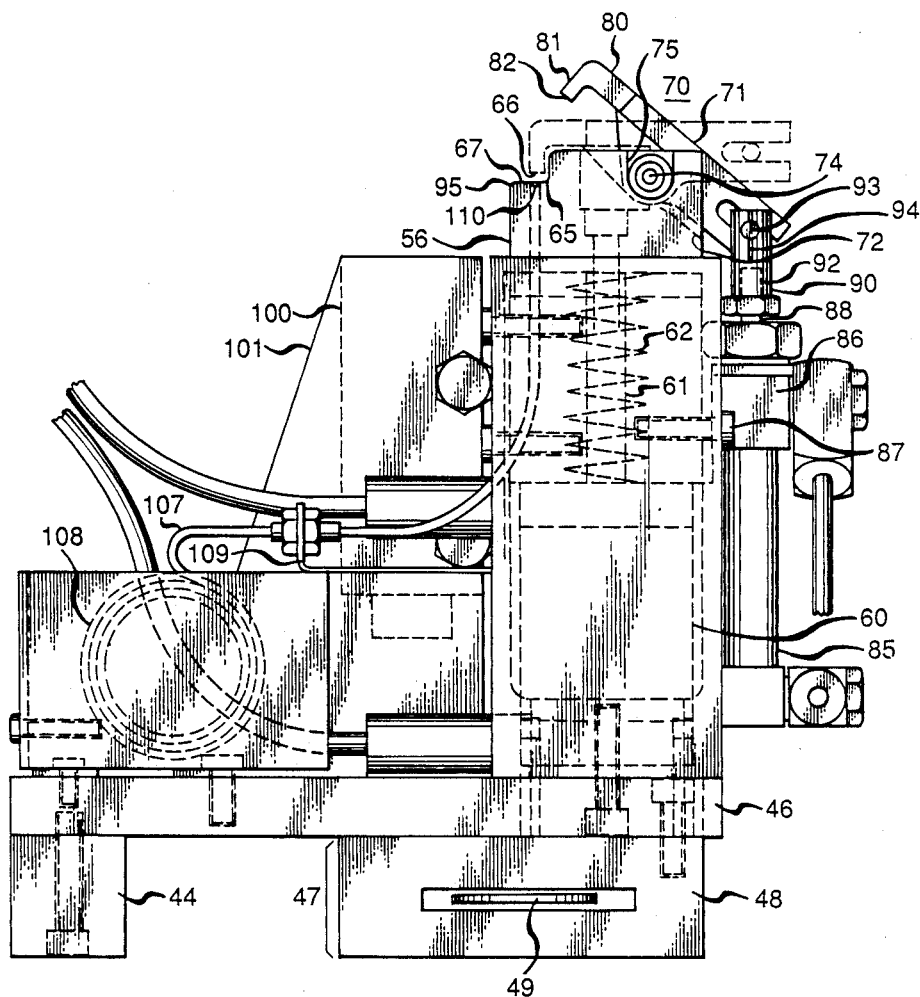
FIG. 5 is a front elevation of the FIG. 4 device.

Referring to FIG. 2, there is shown a perspective view of the device or stand 40, with its sensors (described hereinafter) having been omitted for clarity of illustration. The device 40 is mounted on bed plate 11 and, with respect to the travel direction indicated by arrow 19, the device 40 is downstream of device 40' and is shown adjacent the leading edge portion 33 of board 20 so as to be the leading one of devices 40,40'.

Stand 40 comprises a base 45 (FIG. 5) constituted of a base plate 46, a spacer block 44, and a magnetic clamp 47. Clamp 47 comprises a housing 48 within which is a powerful permanent magnet (not shown) having its poles facing down. The spacing of such poles from the bottom, downward-facing surface of housing 48 is adjustable by the turning of a disc 49 to permit clamp 47 (and thus base 45) to either be held fast firmly to ferromagnetic support plate 11 by the clamp's magnetic force or, alternatively, to be lifted away without great effort from the plate. Clamps of such kind are purchasable from the Spindler and Hoyer Company and other manufacturers.

Upstanding from the plate 46 of base 45 are a pair of laterally spaced guide plates 50,51 having guideways formed in the inner sides thereof. Slidably received in those guideways is a carriage 55 comprising an upper block 56 (FIG. 6) having an integral pair of legs 57,58 depending from laterally opposite sides of such block.

Mounted on base 45 laterally between legs 57 and 58 is drive means in the form of a double-acting air cylinder 60 (FIG. 5) having a drive rod 61 extending upwards from the cylinder to an upper end of the rod which is fixedly secured to the carriage block 56. Encircling rod 61 is a helical damping spring 62. Cylinder 60 is adapted when suitably actuated to shift carriage 55 to (and then hold such carriage at) in and out positions therefor which are, respectively, towards and away from base 45. In moving between those positions, carriage 55 is constrained by guide plates 50,51 to follow a vertical line of movement transverse to the path of travel 24 of boards 20 being transported by conveyor facility 10.

The carriage block 56 has formed in its upper front corner a groove 65 of "L" cross section extending laterally from one side to the other of the block. Groove is bounded at its rear and bottom by, respectively, a laterally extending planar vertical face 66 and a laterally extending planar horizontal face 67, both side faces being outside faces for portions inwards of such faces of the block 56. As later described in more detail, the portions of block 56 bearing the vertical and horizontal faces 66 and 67 are adapted to act, respectively, as a stop means for a board 20 moving in path 21 and as a fixed jaw employed for clamping such board.

The carriage block 56 mounts a rockable lever 70 comprising a rocker arm 71 having a middle section received in a slot 72 formed in the laterally central region of the block and (FIG. 5) extending from its top diagonally downwardly and rearwardly to the rear face of the block. Arm 71 is pivotally supported within such slot by a horizontal pivot pin which is provided by part of the stem of a pin shaft screw 74 whose head is received in a horizontal countersink 75 in block 56, and which screw passes from the block on the countersink side of slot 72 through a horizontal bore in arm 71 and back into the block on the other side of slot 72 to be threadedly received in a hole in such other side.

Within its forward section, lever 70 fans out from arm 71 into a laterally broad head 80 having at its front a downwardly extending nib 81 terminating in a planar end face 82 of the lateral width of the head and adapted to provide for the fixed jaw 67 on block 56 a companion movable gripping jaw 82.

Figure 6:
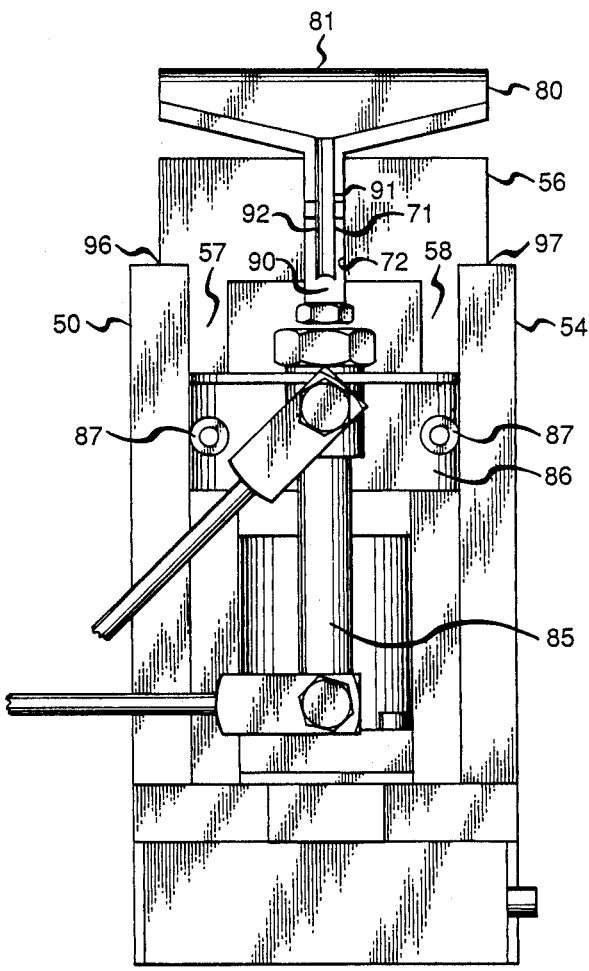
FIG. 6 is a right side elevation of the FIG. 3 device.

The rear section of rocker arm 71 has formed therein a "U"-shaped notch 84 passing laterally through that section and extending in the length of the arm inwards from its back end into the body of arm 71. The carriage 55 has mounted thereon actuator means in the form of a double-acting air cylinder 85 secured to the carriage by a bracket 86 straddling carriage legs 57,58 at their bottoms and attached to such legs by screws 87 (FIG. 6). Extending upwards from cylinder 85 is its drive rod 88 on the top of which is mounted a clevis 90 comprising two upwardly extending tines 91,92 and a gap between them. Disposed in that gap is a portion of rocker arm 71 including its "U" notch. That arm portion is coupled to clevis 90 by a clevis pin 93 having at one end an enlarged head and passing from such head through a hole in tine 91, then through notch 84 in arm 71, and then through a hole in tine 92 to have a portion projecting beyond that tine. Clevis pin 92 is secured in place by a cotter pin 94 driven through a hole in such projecting portion of that clevis pin.

By virtue of the pin coupling just described, cylinder 85, when suitably activated, is adapted to move the rear of rocker arm up and down so as to move the jaw of clamp 70 to corresponding positions at which such jaw is, respectively, relatively towards and away from the fixed jaw 67 of carriage block 56.

Consideration will now be given to specifics of the positions to which the carriage block 56 and the clamp 70 thereon are shifted by the operations of, respectively, air cylinder 60 and air cylinder 85. When stand 40 is magnetically clamped to bed plate 11 and a PWB 20 is moving in the path of travel 21 to approach the stand, carriage 55 will have been shifted to out position, and that position to which it has been shifted and held by air cylinder 60 is such that face 67 of the fixed jaw on the carriage is disposed at the same level as the bottom of the board 20. To take care of situations where such bottom may sag slightly, the front edge portion of face 67 may have a chamfer 95 which will cause any such sagging bottom to ride up onto the face. Moreover, to assure that carriage 55 when driven up by cylinder 60 will stop at its exact out position desired, the carriage legs 57 and 58 on their laterally outer sides have upward-facing shoulders 96,97 adapted to strike the bottom of lips (not shown) formed on the inner side of the tops of the guideway in guide plates 50,51 to thereby arrest the upward movement of the carriage at such exact position.

After carriage 55 arrives at and is being held at its out position, cylinder 85 is activated to move lever 70 to bring its movable jaw face into a position at which it is adapted to cooperate with jaw face 67 on the carriage to grip an edge portion 33 interposed between them of board 20. When in that gripping position, movable jaw face 82 is disposed directly above and parallel to fixed jaw face 67 and is transversely spaced therefrom by the proper amount to permit such edge portion to be gripped between such jaws while not being injured by them. It will be evident from the foregoing that the portion of carriage block bearing fixed jaw face 67 and the lever or clamp 70 bearing movable jaw 82 cooperate to provide clamp means.

Cylinder 85 will thereafter be operated to cause lever 70 to release the board. At that time, clamp 70 is rotated clockwise (FIGS. 2 and 5) sufficiently to assure that the nib 81 on the front of the clamp is translationally displaced far enough rearwardly that it will be to the rear of the vertical plane containing the stopping end face 66 formed on the carriage. Imparting such rearward displacement to nib 81 is necessary in order for the nib to clear the front end of the board (which will still be at the longitudinal position it occupied when engaged with stop face 66 on the carriage) when such carriage is driven to in position by cylinder 60.

Stand 40 carries a coarse optical sensor 100 which may be an Omron Special Purpose Photoelectric Sensor, Model E35-DS10B4, purchasable from the Omron Company. Sensor 100 is mounted on a fin 101 upstanding from base 45. When in use, sensor 100 transmits upward a beam of light 102 (FIG. 2) some of which, as a board 20 in its travel comes close to the stand, is reflected by the board to pass via path 103 back to the sensor to be detected thereby and produce an electric signal.

The stand 40 moreover carries a fine sensor 105 which may be an Omron Sensor Model E3XR-CB4 purchasable from the Omron Company. Sensor 105 comprises a housing 106 and a fiber optic cable 107 extending from that housing to a supply of such cable in the form of coil 108 and, from there, to a bracket 109 fastened to carriage 55 and, subsequently, within the block 56 of the carriage, to an opening 110 in the flat jaw face 67 formed on that block. Housing 106 contains an LED and a photoelectric detector (not shown), and cable 107 contains both a transmitting optic fiber and a receiving optic fiber (not shown). When fine sensor 105 is in use, light from the LED passes through the transmitting fiber to emerge from opening 110 as an upwardly directed beam. At such times as the front edge portion 33 of a board 20 is over that opening, some of the light from such beam will be reflected from the board in a downward path into opening 110 to be passed along by the receiving fiber to the mentioned detector to cause it to responsively produce an electric signal indicating the presence in "L" groove 65 of that part of the board.

The stand 40' (FIGS. 1 and 2) is essentially a duplicate of stand 40 except that stand 40' does not have the sensors 100 and 105 with which stand 40 is equipped.

For purposes of coordinating its various operations, the conveyor facility 10 is provided with a computer 120 in the nature of a programmable logic controller. The air cylinders 60, 85, 60', 85' of stands 40, 40' are pneumatically controlled by respective 5-ported, 4-way, 2-position valves 130, 135, 130', 135' connected to their associated cylinders via air lines (shown by dot-dash lines) receiving air through such valves from a common air line 136. Valve 135' may be eliminated and both of the cylinders 85 and 85' may be controlled by solely the valve 135. The valves 130, 135, 130', 135' are solenoid-actuated valves in turn electrically controlled from computer 120 via the shown electrical control lines represented in FIG. 2 by solid lines. That computer is also adapted to control the described conveyor motors 18, aligners 28, and side clamps 30,31 via its shown connections therewith. Another function computer 120 has is to interact with a visual board scanner 140 which is in the nature of equipment adapted to visually scan for defects on a board 20 which is being transported by conveyor facility 10, and which has been stopped in its travel and then aligned and clamped. As shown, the computer receives electrical inputs from the sensors 100,105, Moreover, the computer is adapted to receive further electrical inputs over one or more control lines represented by the shown line 141. One such input may be a signal indicating when a board 20 has been placed on the conveyor means (belts 16,17) for purposes of transport of the board by such means.

USE AND OPERATION OF EMBODIMENTS

Preliminary to operating conveyor facility 10 (FIGS. 1 and 2) to move a board 20 in the path of travel 21 in the direction of arrow 19, stands 40 and 40' are seated on bed 11, with stand 40 leading stand 40' with respect to such direction, and with the respective stop faces 66 and 66' of the two stands being spaced from each other in the length of path 21 so that board 20 will fit between those faces with small clearance. Stand 40 is used as the leading one because it carries the sensors 100 and 105.

After being seated on bed 11, the two stands are firmly clamped thereto by the use of the magnetic clamps 47,47' in their bases 45,45'. If the direction of board movement is to be the reverse of that indicated by arrow 19, the positions of stands 40 and 40' are reversed from those shown in FIG. 2. An advantage of such devices being magnetically clamped stands (as are devices 40,40') is that it is very easy to switch the positions of the devices so as to keep the stand with the sensors in the leading position. More than that, either of the stands can be magnetically clamped in an indefinitely large number of positions on ferromagnetic bed 11 so as to be able to be used with PWBs or other articles having a large range of sizes in the travel dimension of path 21. Further advantages of the fastening of devices 40,40' to bed 11 by magnetic clamping are that articles in path 21 can be both stopped and clamped at an indefinitely large number of positions therein.

Assume now that the air cylinders of the stands 40 and 40' are powered by air from air line 136, that all of the devices controlled by or controlling computer 120 are in their "on" state, and that a cycle of operation is commenced by the placing of board 20 on endless belts 16,17 upstream of the lagging stand 40'. Such placing of the board will produce on lead 141 a signal inducing computer 120 to initiate energization of motor 18 to drive the belts to transport the board towards the stands.

At the beginning of the cycle, carriage 55' on stand 40' is controlled by valve 130' and drive means 60' to be in its in or "down" position so that all elements of the stand are far enough below path 21 that the board 20 in its travel will clear stand 40' and pass it by. The carriage 55 of stand 40 is, on the other hand, controlled by its valve 130 and drive means 60 to be in its out or "up" position so that its stop and jaw faces 66 and 67 are, respectively, (i) in path 21 ahead of the leading edge portion 33 of the board, and (ii) at the level of the bottom of that edge portion. On both of stands 40 and 40', their rocker levers 70 and 70' are angularly tilted to their non-gripping positions with the nibs 81,81' on those levers being lifted away from the fixed jaws 67,67' on the associated carriages.

As board 20 travels towards leading stand 40, the passage of edge portion 33 of the board over coarse sensor 100 causes light from the transmitted beam 102 to be reflected from the board downward in path 103 and to be detected to result in an electrical output. That sensor output is fed to computer 20 to induce it to de-energize the conveyor motor 18 for the endless belts 16,17. The momentum, however, of the motor and belts causes them to coast to continue to advance board 20 forward until it lodges against vertical end face 66 on stand 40 to be stopped by that face with the board's front edge portion 33 resting on the horizontal jaw face 67 on the carriage 55.

Substantially concurrently with such stopping of the board, the passage of its edge portion 33 over the opening 110 (FIG. 5) in face 67 causes the fine sensor 105 to generate an electrical signal fed to computer 120. The computer responds to that signal to (after a small delay) initiate the following sequence of actions. First, the aligning devices 28 are activated to drive respective tooling pins (not shown) into the aligning holes 26,27 in the board to produce the exact desired angular and translation alignment of that board in the horizontal plane. Second, valve 130' is activated to control air cylinder 60' to shift carriage 55' of stand 40' to its out or "up" position at which jaw face 67' on the carriage bears against the underside of lagging portion 32 of the board. While carriage 55' is being so moved up, clamp 70' is in non-gripping position to dispose nib 81' to the rear of stop face 66' so that the nib can pass by the board 20.

Third, the computer then activates side clamps 30,31 and also (via valves 135,135' and air cylinders 85,85') the clamps 70 and 70' so that the board 70 is clamped on all four sides by these four clamps. In such connection, the air cylinders 85,85' operate by driving their rods 88,88' to rock the associated rockable levers 70,71' about their pivot pins 74,74' to gripping positions of such levers at which the front and rear edge portions 33 and 32 of board 20 are, respectively, gripped between the jaw faces 67,82 and the jaw faces 67',82' of the two stands 40 and 40'.

With board 20 being clamped as described on all four sides, the computer 120 sends a signal to board scanner 140 to start its operation. Scanner 140 constitutes equipment adapted to scan the components 24 on board 20 by a sweeping light beam and to produce by such scanning an output in the form of data fed back to the computer and indicating defects or the lack of them in or related to the components scanned. A further description of details of the equipment 140 is beyond the scope of the disclosure hereof.

When scanner 140 completes its operation, a signal to that effect is fed back to computer 120, which thereupon initiates the following sequence of actions. First, board 20 is unclamped on its four sides by the lifting away from the board of the side clamps 30,31 and by the activation of valves 135,135' to control air cylinders 85,85' to impel levers 70 and 70' to their non-gripping positions at which their nibs 81,81' are lifted away from fixed jaw faces 67,67' and are to the rear of vertical stop faces 66,66'. Second, the valves 130 and 130' are activated to control air cylinders 60 and 60' to shift both of carriages 55 and 55' to their in or down positions. Third, motors 18 are re-energized to drive belts 16,17 to restart the travel of board 20 in path 21. Fourth, after a delay sufficient for the board to pass by stand 40 in its down position so that all elements of the stand are cleared by the board, valve 130 is reactivated to control air cylinder 60 to shift the carriage 55 back to its out or "up" position. With that action having taken place, the described cycle of operation has been completed and the facility is ready to undertake a new such cycle when a new board 20 is placed on the conveyor means 16,17.

The above-described embodiments being exemplary only, it is to be understood that additions thereto, omissions therefrom, and modifications thereof can be made without departing from the spirit of the invention. For example, in the FIG. 2 setup, the trailing device 40' does not perform any stopping function and need not, therefore, provide any stop means.

Accordingly, the invention is not to be considered as limited save as is consonant with the recitals of the following claims.

I claim:

1. A clamp device for articles traveling in a path comprising: base means for such device mountable along said path, clamp means borne by said base means and adapted when in such path to clamp an article stopped in its travel in said path and to subsequently release said article, and means to shift such clamp means between out and in positions therefor relatively toward and away from said base means and at which, respectively, said clamp means is interposed in said path to so clamp and release said article and said clamp means is withdrawn from said path to clear said device, said device being portable, and such base means including magnetic clamp means for clamping said device by magnetic force in place by any one of an indefinite number of locations therefor along said path for such articles.

2. A device according to claim 1 further comprising: stop means borne by said base means for effecting such stopping of such travel in said path of said article prior to its clamping by said clamp means, and means borne by said base means for commonly carrying said clamp means and stop means so that they are adapted to be shifted together between in and out positions therefor.

3. A device according to claim 1 further comprising sensor means borne by said base means and responsive to the arrival of such article at a predetermined position in said path in relation to said clamp means for said article, to produce an output signalling the presence of such article.

4. A stop/clamp device for articles traveling in a conveyor path comprising: a base for said device mountable next to said path, guide means on said base, a carriage on said base and guided by such means to be movable in a line of movement transverse to said path between (a) an in position towards said base at which said device clears said path, and (b) an out position away from said base, drive means coupled to said carriage and controllably operable to shift selectively said carriage between said in and out positions, stop means located on said carriage to be disposed in said path when said carriage is at said out position so that said stop means is adapted to engage such a traveling article to stop its travel in said path, clamp means disposed on said carriage adjacent said stop means and comprising means providing on the front of said carriage a fixed jaw having a jaw surface facing away from said base and adapted to be on the side of such path towards said base when said carriage is in its out position, said clamp means further comprising movable means mounted on said carriage and providing a movable jaw, and actuator means coupled to said clamp means and controllably operable to selectively impel such movable means between gripping and release positions therefor at which said movable jaw is positioned relatively near to and far from, respectively, said fixed jaw so that such two jaws are adapted to, respectively, grip such article and release such article, said actuator means being adapted when such article is so stopped to impel such movable means to such gripping disposition so as to clamp said article in fixed relation to said base, said actuator means being further adapted to subsequently impel said movable means to such non-gripping disposition so as to release said article, and said drive means being thereupon adapted to shift said carriage to said in position to thereby enable said article to pass by said device and resume its travel.

5. A device according to claim 4 in which said stop means comprises a portion of said carriage disposed at the top and front thereof and having a stop surface facing forwardly from said carriage in a direction substantially normal to said line of movement of said carriage.

6. A device according to claim 4 in which, when said movable means is at said release position therefor, all of said movable means is rearward of said stop means.

7. A device according to claim 6 in which said movable means comprises a rockable lever pivotally mounted on said carriage.

8. A device according to claim 7 in which said carriage has formed therein at its front and top a lateral groove of "L" cross section and bounded at its bottom and rear by, respectively, such fixed jaw surface and a stop surface at the front of a portion of said carriage constituting said stop means.

9. A device according to claim 8 in which said fixed jaw surface has an outwardly looking opening therein and in which said device further comprises optical sensor means coupled to said opening to transmit light out of it and to receive any of such light reflected back to such opening, said sensor means being responsive to any such received light to produce an output signaling the presence of an article at least approximately at its stopped position in relation to said stop surface.

10. A method of handling articles comprising: conveying such articles in a path of travel therefor in a selected direction, disposing along said path in spaced relation in the length thereof a pair of clamp means each positioned within the width occupied in said path by such articles, at least the leading one of such means being also a stop means, interposing such leading means in such path while maintaining the trailing one of such means out of said path far enough to avoid interfering with the travel therein of said articles, transporting such an article in said path until such article engages said leading means to be blocked thereby so that said article is stopped, interposing said trailing means in said path, gripping respective edge portions of said stopped article by said leading and trailing means, performing an operation with respect to said gripped article, impelling such two means to each release said article, and withdrawing such leading means from said path so that such article is no longer blocked and is thereby free to resume its travel in said path.

* * * * *